(12) United States Patent
Koh

(10) Patent No.: US 7,374,959 B2
(45) Date of Patent: May 20, 2008

(54) TWO-WAVELENGTH SEMICONDUCTOR LASER DEVICE AND METHOD OF MANUFACTURING THE SAME

(75) Inventor: Chong Mann Koh, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 189 days.

(21) Appl. No.: 11/439,128

(22) Filed: May 24, 2006

(65) Prior Publication Data

US 2006/0208278 A1    Sep. 21, 2006

Related U.S. Application Data

(62) Division of application No. 10/937,330, filed on Sep. 10, 2004, now Pat. No. 7,071,497.

(30) Foreign Application Priority Data

Mar. 31, 2004    (KR) ............ 10-2004-22116

(51) Int. Cl.
```
H01L 21/00    (2006.01)
H01S 3/10     (2006.01)
H01S 3/13     (2006.01)
H01S 5/00     (2006.01)
```
(52) U.S. Cl. ............ 438/22; 438/28; 438/35; 438/39; 438/42; 438/46; 372/23; 372/29.013; 372/46.01; 372/46.011; 372/50.1; 372/50.121; 372/68; 257/E33.031; 257/E33.032; 257/E33.033; 257/E33.034; 257/E33.027

(58) Field of Classification Search ............ 438/39, 438/42, 46, 35, 28; 372/23, 29.013, 50.1, 372/50.121, 68, 46.01, 46.011; 257/E33.031–E33.034, 257/E33.027
See application file for complete search history.

(56) References Cited

U.S. PATENT DOCUMENTS

| | | | |
|---|---|---|---|
| 5,472,907 A * | 12/1995 | Binsma et al. | ............ 438/31 |
| 5,999,553 A | 12/1999 | Sun | |
| 6,480,456 B1 | 11/2002 | Kawamura et al. | |
| 6,546,035 B2 | 4/2003 | Imafuji et al. | |

(Continued)

FOREIGN PATENT DOCUMENTS

JP    11-112108    4/1999

(Continued)

OTHER PUBLICATIONS

Chinese Patent Office, Office Action mailed Oct. 13, 2006and English Translation.

*Primary Examiner*—David Vu
*Assistant Examiner*—Arman Khosraviani
(74) *Attorney, Agent, or Firm*—Lowe Hauptman Ham & Berner

(57) ABSTRACT

A two-wavelength semiconductor laser device includes a first conductive material substrate having thereon first and second regions separated from each other. A first semiconductor laser diode is formed on the first region. A non-active layer is formed on the second region and has the same layers as those of the first semiconductor laser diode. A second semiconductor laser diode is formed on the non-active layer. A lateral conductive region is formed at least between the first and second semiconductor laser diodes.

10 Claims, 4 Drawing Sheets

U.S. PATENT DOCUMENTS

| | | | |
|---|---|---|---|
| 6,875,627 B2 * | 4/2005 | Bour et al. | 438/22 |
| 7,095,051 B2 * | 8/2006 | Nagahama et al. | 257/79 |
| 7,112,456 B2 * | 9/2006 | Park et al. | 438/22 |
| 2005/0105845 A1 * | 5/2005 | Oeda et al. | 385/24 |

FOREIGN PATENT DOCUMENTS

| | | |
|---|---|---|
| KR | 2004-5269 | 1/2004 |
| TW | 443017 | 6/2001 |

* cited by examiner

TWO-WAVELENGTH SEMICONDUCTOR LASER DEVICE AND METHOD OF MANUFACTURING THE SAME

RELATED APPLICATIONS

This application is a divisional of application Ser. No. 10/937,330, filed Sep. 10, 2004 now U.S. Pat. No. 7,071,497, and is based on, and claims priority from, Korean Application Number 2004-22116, filed Mar. 31, 2004, the disclosure of which is hereby incorporated by reference herein in its entirety.

BACKGROUND OF THE INVENTION

1. Field of the Invention

The present invention relates to a semiconductor laser device, and more particularly to a two-wavelength semiconductor laser device, which can emit light having two different wavelengths, and a method of manufacturing the same.

2. Description of the Related Art

Generally, a semiconductor laser device is a semiconductor device for emitting light amplified by stimulated emission, wherein the emitted light has a narrow frequency width (short wavelength characteristic) and ensures a high power, as well as excellent directivity. Due to the characteristics as mentioned above, the semiconductor laser device is widely applied to the field of optical fiber communication, multiplex communication, space communication and the like, as well as a light source for an optical pick-up apparatus of an optical disc system, such as CD, DVD and the like.

Recently, in the field of optical discs using the laser as the light source for recording and reproducing information, there is a need to provide a two-wavelength semiconductor laser device, which can oscillate at two different wavelengths. In particular, the two-wavelength semiconductor laser device is actively adopted as a light source for concurrently implementing a CD reproducer having a relatively low density and a DVD reproducer having a relatively high density. The two-wavelength semiconductor laser device has a laser diode for generating a beam having a wavelength of 780 nm on a single substrate and a structure for generating a beam having a wavelength of 650 nm.

FIG. 1 is a sectional side elevation illustrating a conventional two-wavelength semiconductor laser device.

Referring to FIG. 1, the conventional two-wavelength semiconductor laser device 10 includes a first semiconductor laser diode 10a and a second semiconductor laser diode 10b formed on a single substrate 11. The first and second semiconductor laser diodes 10a and 10b are separated by a predetermined isolation region, and are structured such that they emit light having fist and second wavelengths, respectively. The light having the first wavelength is laser light having a wavelength of 650 nm, and the light having the second wavelength is laser light having a wavelength of 780 nm.

Each of the first and second semiconductor laser diodes 10a and 10b may have an SBR (Selectively Buried Ridge) structure with a first conductive clad layer 12a or 12b, an active layer 13a or 13b, and a second conductive clad layer 14a or 14b sequentially laminated thereon. The SBR structure of the first and second semiconductor laser diodes 10a and 10b includes a second conductive clad layer 14a or 14b having a ridge structure, a first conductive material current shield layer 15a or 15b formed around the second conductive clad layer 14a or 14b, and a second conductive contact layer 16a or 16b connected with the second conductive clad layer 14a or 14b on the first conductive material current shield layer 15a or 15b. The substrate 11 is provided with a first electrode 17 acting as a common electrode at the bottom of the substrate 11 and the second conductive contact layers 16a and 16b are provided with second electrodes 18a and 18b, respectively, so that the first and second semiconductor laser diodes 10a and 10b can be independently driven.

According to one conventional method of manufacturing the two-wavelength semiconductor laser device, after being separately manufactured, the semiconductor laser diodes 10a and 10b are coupled onto the same substrate 11 by a die-bonding process. However, this method has problems in that in addition to the manufacturing process of the semiconductor laser diodes 10a and 10b, a separate bonding process is required, thereby complicating the overall process. Moreover, this method has problems in that bad alignment can be caused in the die-bonding process, and in that miniaturization of a semiconductor chip is difficult.

According to another conventional method, after a mask (not shown) is formed such that only a first region is exposed on a single substrate 11, a first semiconductor laser diode 10a for emitting light having a first wavelength is formed on the first region, and after removing the mask, a second semiconductor laser diode 10b for emitting light having a second wavelength is formed at a second region on the substrate 11.

However, the other method requires repetitious formation and removal processes for the mask. Further, since crystal growth processes for growing the first and second semiconductor laser diodes must be suspended, there still exists the problem of complicating the total process. Particularly, as the surface corresponding to the second region of the substrate 11 is damaged due to an etching process for removing the mask, the method has a disadvantage causing a problem in the crystal growth process for the second semiconductor laser diode 10b.

SUMMARY OF THE INVENTION

The present invention has been made to solve the above problems, and it is an object of the present invention to provide a new two-wavelength semiconductor laser device, which can be manufactured through a continuous semiconductor crystal growth process.

It is another object of the present invention to provide a method of manufacturing a new two-wavelength semiconductor laser device, which grows crystals for first and second semiconductor laser diodes using a continuous semiconductor crystal growth process.

In accordance with one aspect of the present invention, the above and other objects can be accomplished by the provision of a two-wavelength semiconductor laser device, comprising: a first conductive material substrate having an upper surface with first and second regions separated from each other; a first semiconductor laser diode comprising a first conductive material first clad layer, a first active layer and a second conductive material first clad layer sequentially laminated on the first region of the first conductive material substrate; a non-active layer formed on the second region of the first conductive material substrate and comprising the same layers as those of the first conductive material first clad layer, the first active layer and the second conductive material first clad layer; a second semiconductor laser diode comprising a first conductive material second clad layer, a second active layer and a second conductive material second clad layer sequentially laminated on the non-active layer; and a lateral conductive region formed at least between the first and second semiconductor laser diodes such that the second conductive material first clad layer and the first conductive material substrate can be electrically connected to each other.

Preferably, the first and/or second semiconductor laser diodes can be realized to have a selectively buried ridge (SBR) structure. For instance, the first semiconductor laser diode may comprise: the second conductive material first clad layer having a ridge structure; a first conductive material first current shield layer formed around the ridge structure; and a first conductive material first contact layer formed on the first conductive material first current shield layer and the second conductive material first clad layer. Further, the second semiconductor laser diode may comprise: the second conductive material first and second clad layers having a ridge structure, respectively; a first conductive material second current shield layer formed around the ridge structure; and a first conductive material second contact layer formed on the first conductive material second current shield layer and the second conductive material second clad layer.

When providing semiconductor laser diodes having the SBR structures, respectively, the first and second current shield layers and the lateral conductive region may consist of a first conductive material. Further, the first and second contact layers may consist of a second conductive material, and may further comprise a second conductive material layer consisting of the same material as that of the first and second contact layers.

The two-wavelength semiconductor laser device of the present invention may further comprise an insulative separation structure for preventing the lateral conductive region from being connected with an undesired region.

More specifically, the two-wavelength semiconductor laser device of the present invention may further comprise a first insulative trench formed between the first semiconductor laser diode and the lateral conductive region while extending from an upper portion of the first semiconductor laser diode to at least a portion of the first conductive material first clad layer. Similarly, the two-wavelength semiconductor laser device of the present invention may further comprise a second insulative trench formed between the second semiconductor laser diode and the lateral conductive region while extending from an upper portion of the second semiconductor laser diode to at least a portion of the first conductive material second clad layer.

Further, in order to maintain a phase difference between the first and second semiconductor laser diodes within an allowable limit, the second conductive material first clad layer and the first conductive material second clad layer may have a total thickness of about 2 μm or less.

The first conductive material first clad layer of the first semiconductor laser diode and the first conductive material clad layer of the non-active region may be formed as a single layer, and the lateral conductive region may be formed on either side of the second semiconductor laser diode.

In accordance with another aspect of the present invention, there is provided a method of manufacturing a two-wavelength semiconductor laser device, comprising the steps of: a) preparing a first conductive material substrate; b) laminating a first conductive material first clad layer, a first active layer and a second conductive material first clad layer on the first conductive material substrate in sequence; c) laminating a first conductive material second clad layer, a second active layer and a second conductive material second clad layer on the first conductive material substrate in sequence; d) removing an intermediate region of a semiconductor structure laminated in the step c) such that the semiconductor structure can be divided into a first region and a second region, followed by removing the first conductive material second clad layer, the second active layer and the second conductive material second clad layer from a portion corresponding to the first region; and e) forming a lateral conductive region formed at least between the first and second regions such that the second conductive material first clad layer of the second region and the first conductive material substrate can be electrically connected to each other.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 1:
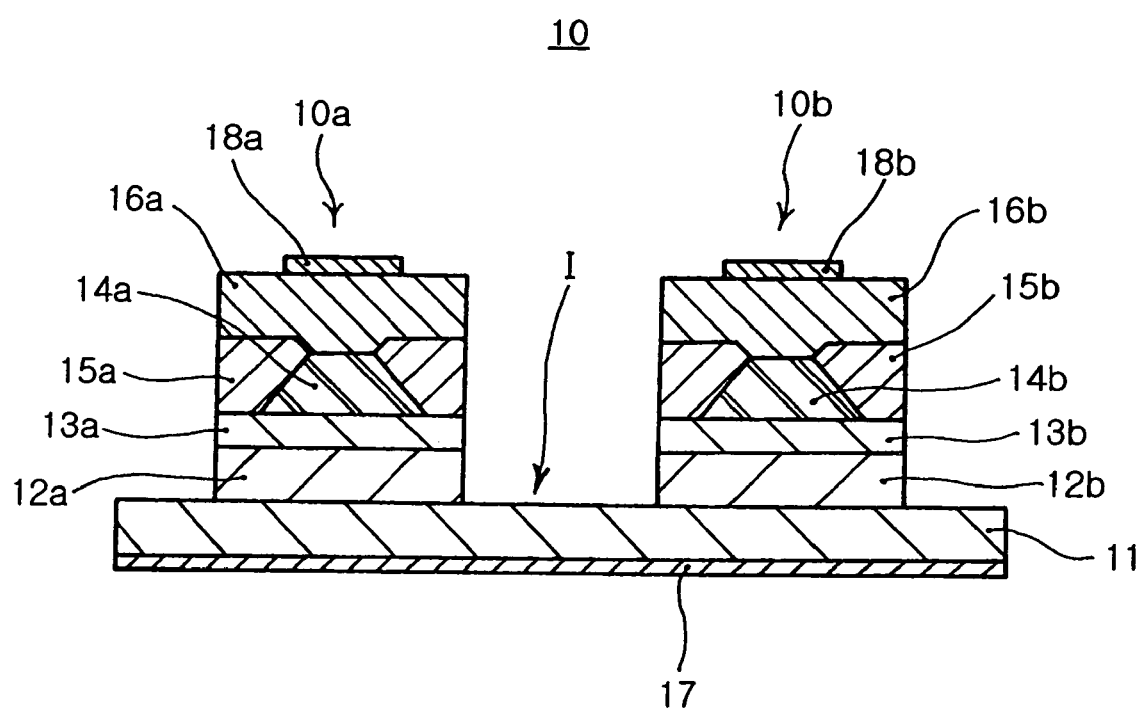
FIG. 1 is a sectional side elevation of a conventional two-wavelength semiconductor laser device.
Figure 2A:
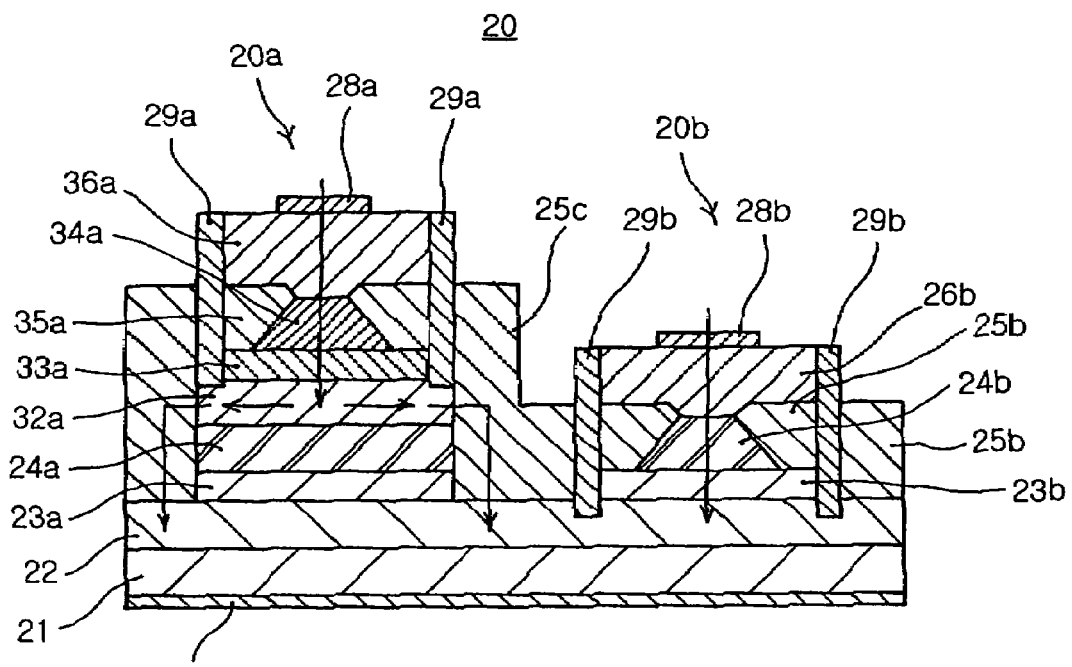
FIGS. 2a and 2b are a sectional side elevation and a top view of a two-wavelength semiconductor laser device according to a preferred embodiment of the present invention, respectively.
Figure 2B:
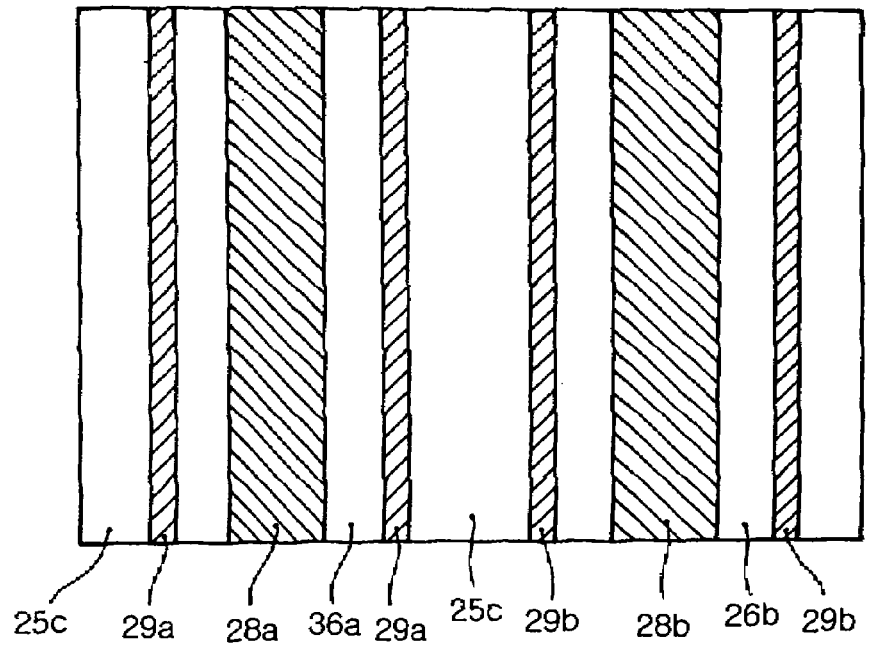

FIGS. 2a and 2b are a sectional side elevation and a top view of a two-wavelength semiconductor laser device 20 according to a preferred embodiment of the present invention, respectively.

Referring to FIG. 2a, the two-wavelength semiconductor laser device 20 is formed on a single conductive substrate 21, and comprises first and second semiconductor laser diodes 20b and 20a, which emit light having different wavelengths, respectively.

The first semiconductor laser diode 20b comprises a first conductive material first clad layer 22, a first active layer 23b and a second conductive material first clad layer 24b sequentially laminated on the first conductive material substrate 21. Moreover, the first semiconductor laser diode 20b may have a selectively buried ridge (SBR) structure. Specifically, as shown in FIG. 2a, the second conductive material first clad layer 24b is formed into a ridge structure, and the first semiconductor laser diode 20b may comprise a first conductive material first current shield layer 25b formed around the ridge structure of the second conductive material first clad layer 24b and a second conductive material first contact layer 26b formed on the first conductive material first current shield layer 25b.

The first conductive material substrate 21 is provided with a non-active layer at the other side thereof. Although the non-active layer comprises the active layer, the active layer in this region is not driven due to a pn-junction. The non-active layer is formed with the same layers 22, 23a and 24a as those of the first conductive material first clad layer 22, the first active layer 23b and the second conductive material first clad layer 24b of the first semiconductor laser diode. As in the present embodiment, the first conductive clad layer of the non-active region may be integrally formed with the first conductive material first clad layer of the first semiconductor laser diode, or the first conductive clad layer may be formed separately from the first conductive material first clad layer of the first semiconductor laser diode, like the first active layer.

Further, the second semiconductor laser diode 20a is formed on the non-active region. The second semiconductor laser diode 20a comprises a first conductive material second clad layer 32a, a second active layer 33a and a second conductive material second clad layer 34a sequentially laminated on the non-active layer. Moreover, similar to the first semiconductor laser diode 20b, the second semiconductor laser diode 20a may have the SBR structure. That is, the second conductive material second clad layer 34a may have the ridge structure, and the second semiconductor laser diode 20a may comprise a first conductive material second current shield layer 35a formed around the ridge structure and a second conductive material second contact layer 36a formed on the first conductive material second current shield layer 35a.

Further, the two-wavelength semiconductor laser device 20 of the invention further comprises a lateral conductive region 25c formed at least between the first and second semiconductor laser diodes 20b and 20a such that the first conductive material second clad layer 32a and the first conductive material substrate 21 can be electrically connected to each other.

In the present invention, when a voltage is applied between a first electrode 27 provided at the bottom of the substrate 21 and a second electrode 28a of the second laser diode 20a, a reverse voltage is applied to a junction between the second conductive clad layer 24a on the non-active layer and the first conductive material second clad layer 32a of the second semiconductor laser diode 20a, so that the current no longer flows in the perpendicular direction within the range of a typical driving voltage, which does not generate a tunneling current. Thus, as indicated by an arrow, the current flows along the lateral conductive region 25c toward the first electrode 27.

In addition, as in the present embodiment, it is desirable that the lateral conductive region 25c be formed at either side of the second semiconductor laser diode 20a in order to uniformly distribute the electric current.

Preferably, the lateral conductive regions 25c may consist of a first conductive material, which is the same as that of the first and second current shield layers 25b and 25a, in the same process as that for forming the first and second current shield layers 25b and 25a. The lateral conductive regions 25c may be spaced from an undesired region by a predetermined distance such that the lateral conductive region 25c is not electrically connected with the undesired region. More preferably, the lateral conductive region 25c is electrically separated from the undesired region using first and second insulative trenches 29b and 29a.

The first insulative trench 29b may be formed between the first semiconductor laser diode 20b and the lateral conductive region 25c while extending from an upper portion of the first semiconductor laser diode 20b to at least a portion of the first conductive material first clad layer 23b such that the lateral conductive region 25c may be separated from the first semiconductor laser diode 20b. Moreover, the second insulative trench 29a may be formed between the second semiconductor laser diode 20a and the lateral conductive region 25c while extending from an upper portion of the second laser diode 20a to at least a portion of the first conductive material second clad layer 32a such that the lateral conductive region 25c may be separated from the undesired region of the second semiconductor laser diode 20a. FIG. 2b is a top view of the semiconductor laser diode having the first and second insulative trenches 29b and 29a formed thereon.

As shown in FIG. 2b, the first and second insulative trenches 29b and 29a may be formed in the direction of the ridge structure.

Since a total thickness of the second conductive material first clad layer 24a or 24b and the first conductive material second clad layer 32a causes a phase difference between light sources of the first and second semiconductor laser diode 20b and 20a, the second conductive material first clad layer 24a and the first conductive material second clad layer 24b preferably has a total thickness of about 2 μm or less in order to maintain the phase difference of the light sources within an allowable limit.

In the present invention, all of the layers pertaining to the first and second semiconductor laser diodes 20b and 20a can be continuously formed, and in this case, the second semiconductor laser diode 20a is further provided with the lateral conductive region 25c acting as a current path, thereby being driven.

FIGS. 3a to 3d are cross sectional views showing steps for manufacturing the two-wavelength semiconductor laser device according to the preferred embodiment of the present invention, respectively.

Figure 3A:
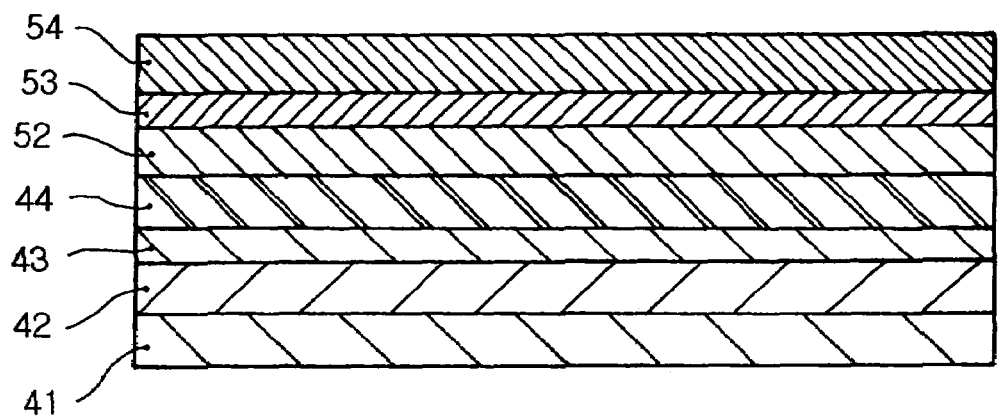
FIGS. 3a to 3d are cross sectional views showing steps for manufacturing the two-wavelength semiconductor laser device according to the preferred embodiment of the present invention, respectively.

First, as shown in FIG. 3a, in order to form a first semiconductor laser diode on a first conductive material substrate 41, a first conductive material first clad layer 42, a first active layer 43 and a second conductive material first clad layer 44 are sequentially formed on the first conductive material substrate 41. Next, a first conductive material second clad layer 52, a second active layer 53 and a second conductive material second clad layer 54 are sequentially formed on the second conductive material first clad layer 44 in order to form a second semiconductor laser diode. The first conductive material substrate 41 may be an n-type GaAs substrate, and the respective clad layers 42, 44, 52 and 54 may be formed of AlGaInP layers. Moreover, the first and second active layers 43 and 53 may consist of AlGaInP/GaInP layers, which emit light having different wavelengths, respectively.

Figure 3B:
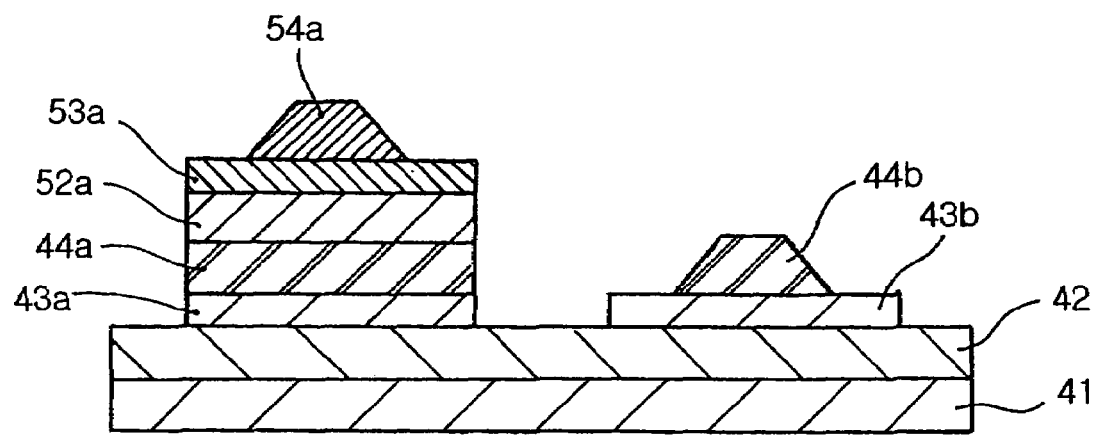

Then, as shown in FIG. 3b, an intermediate region of a semiconductor structure laminated as described above is removed such that the semiconductor structure can be divided into a first region and a second region, and the first conductive material second clad layer 52, the second active layer 53 and the second conductive material second clad layer 54 are removed from a portion corresponding to the first region. Further, as shown in FIG. 3b, in order to form an SBR structure, a second conductive material first clad layer 54b and a second conductive material second clad layer 44b are etched to form the ridge structure. Meanwhile, according to the present embodiment, the process for removing the intermediate region, the process for removing the portion of the first region, and the process for etching to form the ridge structure can be simultaneously performed using masks of different patterns.

Figure 3C:
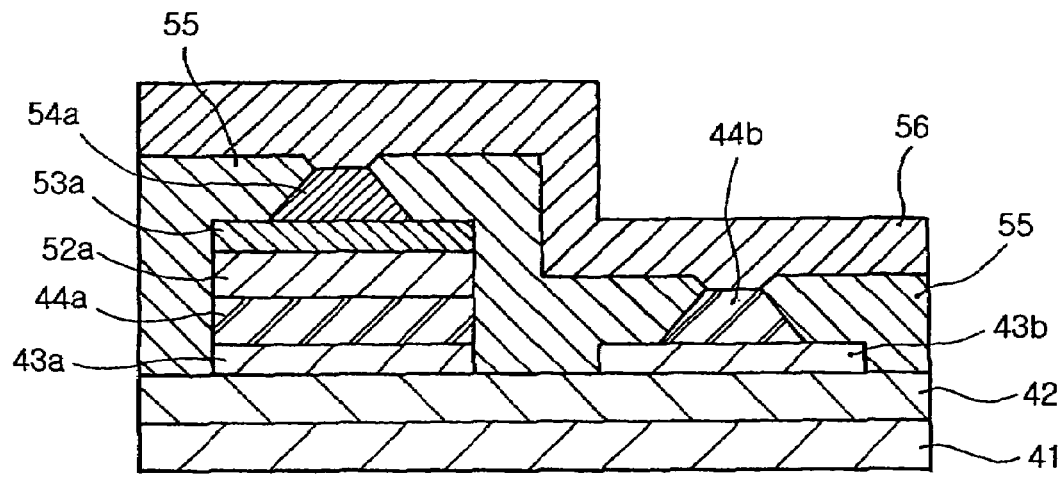

Next, as shown in FIG. 3c, a first conductive material current shield layer 55 is formed around the respective ridge structures, and a second conductive contact layer 56 is formed on the first conductive material current shield layer 55 and respective ridge structures. In the present embodiment, the first conductive material current shield layer 55 may be provided as a lateral conductive region, which connects the first conductive material second clad layer 52a of the second region and the first conductive material first clad layer 42 during the subsequent process. In this case, it is exemplified that the lateral conductive region consists of the same material as that of the first conductive material current shield layer, but the present invention is not limited to this case. That is, after removing the current shield layer 55 and the contact layer 56 between the first and second regions, the first conductive material second clad layer 52a of the second region and the first conductive material first clad layer 42 (in the case where the first conductive material first clad layer is removed, the first conductive material substrate 41) are electrically connected to each other by providing separate conductive materials therebetween.

Figure 3D:
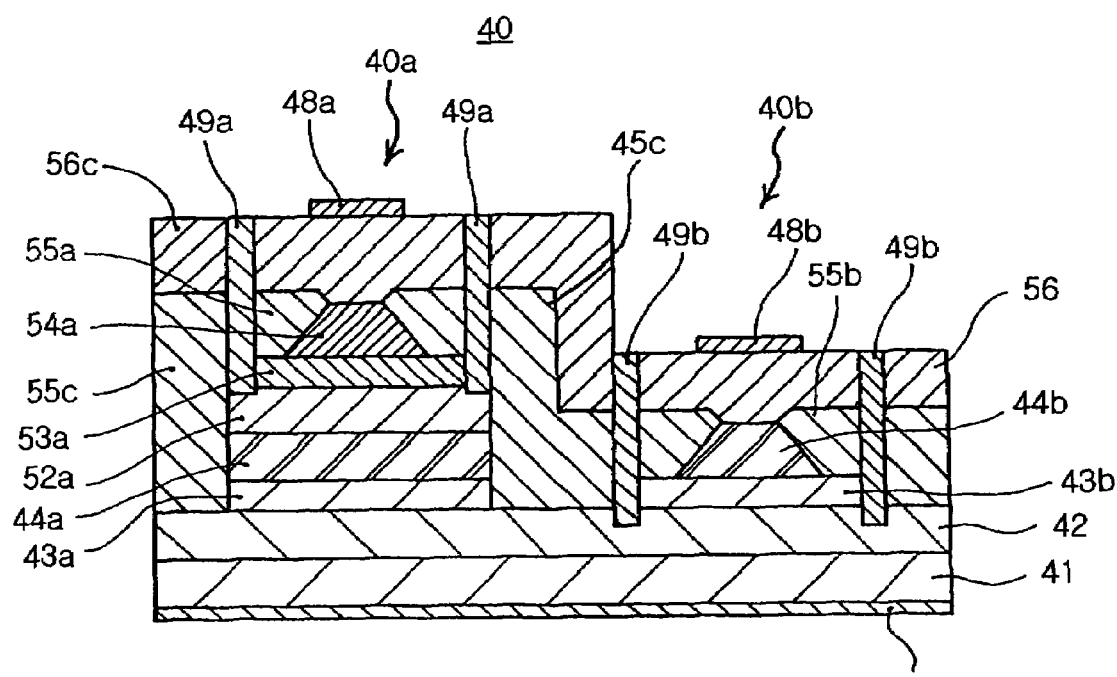

Then, with first and second insulative trenches 49b and 49a formed as shown in FIG. 3d, a lateral conductive region 55c is formed using a portion of the first conductive material current shield layer 55. The first insulative trench 49b may be formed between the first region 45c and the lateral conductive region 45c such that the first insulative trench 49b extends from an upper portion of an upper layer 56b of the first region to at least a portion of the first conductive material first clad layer 43b. Moreover, the second insulative trench 49a may be formed between the second region and the lateral conductive region 45c such that second insulative trench 49a extends from an upper portion 56a of an upper layer of the second region to at least a portion of the first conductive material second clad layer 52a. Next, the first conductive material substrate 41 is provided with a first electrode 47 at the bottom thereof and the respective semiconductor laser diode regions are provided with second electrodes 48a and 48b, respectively.

In such a semiconductor laser diode manufactured as described above, when a voltage is applied between a first electrode 47 and the second electrode 48a, a reverse voltage is applied to a junction between the second conductive clad layer 44a and the first conductive material second clad layer 42a, so that the current no longer flows in the perpendicular direction. Thus, as indicated by an arrow, the current flows along the lateral conductive region 25c toward the first electrode 27.

As apparent from the above description, according to the present invention, there are provided advantageous effects in that the crystal layers pertaining to the two semiconductor laser diodes for emitting the light having two wavelengths can be formed by the continuous semiconductor crystal growth process, and in that the unnecessary etching process disadvantageously influencing the crystal growth plane can be omitted, thereby simplifying the overall process.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A method of manufacturing a two-wavelength semiconductor laser device, comprising the steps of:
   a) preparing a first conductive material substrate;
   b) laminating a first conductive material first clad layer, a first active layer and a second conductive material first clad layer on the first conductive material substrate in sequence;
   c) laminating a first conductive material second clad layer, a second active layer and a second conductive material second clad layer on the first conductive material substrate in sequence;
   d) removing an intermediate region of a semiconductor structure laminated in the step c) such that the semiconductor structure can be divided into a first region and a second region, followed by removing the first conductive material second clad layer, the second active layer and the second conductive material second clad layer from a portion corresponding to the first region; and
   e) forming a lateral conductive region formed at least between the first and second regions such that the second conductive material first clad layer of the second region and the first conductive material substrate are electrically connected to each other.

2. The method as set forth in claim 1, after the step d), further comprising the steps of:
   etching the second conductive material first clad layer of the first region to form a ridge structure;
   forming a first conductive material first current shield layer around the ridge structure; and
   forming a first conductive material first contact layer on the first conductive material first current shield layer and the second conductive material first clad layer.

3. The method as set forth in claim 1, after the step d), further comprising the steps of:
   etching the second conductive material second clad layer of the second region to form the ridge structure;
   forming a first conductive material second current shield layer around the ridge structure; and
   forming a first conductive material second contact layer on the first conductive material second current shield layer and the second conductive material second clad layer.

4. The method as set forth in claim 3, wherein the first and second current shield layers are simultaneously formed of a first conductive material, so that the first conductive material layer is formed between the first and second regions, and wherein the lateral conductive region is formed of the first conductive material.

5. The method as set forth in claim 3, wherein the first and second contact layers are simultaneously formed of a second conductive material, so that the second conductive material layer is formed on the first conductive material layer.

6. The method as set forth in claim 1, wherein the step e) comprises the step of:
   forming a first insulative trench between the first region and the lateral conductive region such that the first insulative trench extends from an upper portion of the first region to at least a portion of the first conductive material first clad layer.

7. The method as set forth in claim 1, wherein the step e) comprises the step of:
   forming a second insulative trench between the second region and the lateral conductive region such that the second insulative trench extends from an upper portion of the second region to at least a portion of the first conductive material second clad layer.

8. The method as set forth in claim 1, wherein the second conductive material first clad layer and the first conductive material second clad layer has a total thickness of about 2 µm or less.

9. The method as set forth in claim 2, wherein the step d) is the step of removing the semiconductor lamination structure to an upper portion of the first conductive material first clad layer between the first region and the second region.

10. The method as set forth in claim 1, wherein the lateral conductive region is formed at either side of the second region.

* * * * *